（12） United States Patent
Cutler

(10) Patent No.: US 10,120,008 B2
(45) Date of Patent: Nov. 6, 2018

(54) METHOD AND APPARATUS FOR ESTIMATING THE NOISE INTRODUCED BY A DEVICE

(71) Applicant: Keysight Technologies, Inc., Santa Rosa, CA (US)

(72) Inventor: Robert T. Cutler, Everett, WA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 917 days.

(21) Appl. No.: 14/014,067

(22) Filed: Aug. 29, 2013

(65) Prior Publication Data

US 2015/0061691 A1    Mar. 5, 2015

(51) Int. Cl.
  G01R 29/26    (2006.01)
  G01R 31/00    (2006.01)

(52) U.S. Cl.
  CPC ........... *G01R 31/001* (2013.01); *G01R 29/26* (2013.01)

(58) Field of Classification Search
  CPC ........ G01R 31/00; G01R 29/26; G01R 27/28; G01R 23/20; G01R 31/002; G01R 31/2837; G06F 17/00
  USPC ......... 324/537, 620, 613; 702/111, 117, 191, 702/69; 703/14; 375/147
  See application file for complete search history.

(56) References Cited

U.S. PATENT DOCUMENTS

| | | | |
|---|---|---|---|
| 6,114,858 A | * | 9/2000 | Kasten ........................ 324/616 |
| 2004/0039540 A1 | * | 2/2004 | Nagasaka ...................... 702/69 |
| 2008/0036865 A1 | | 2/2008 | Liu |
| 2013/0018613 A1 | * | 1/2013 | Chow ............................ 702/69 |

FOREIGN PATENT DOCUMENTS

| | | |
|---|---|---|
| CN | 1266496 A | 9/2000 |
| CN | 1635801 A | 12/2003 |
| CN | 1645944 A | 12/2004 |
| CN | 101123739 A | 8/2006 |
| WO | 99/08125 | 2/1999 |

OTHER PUBLICATIONS

Office Action dated Mar. 6, 2018, China Application No. 201410363645.1.

* cited by examiner

*Primary Examiner* — Jermele M Hollington
*Assistant Examiner* — Akm Zakaria

(57) ABSTRACT

An apparatus and method for measuring the properties of a DUT characterized by a signal gain applied to an input signal to that DUT and a DUT noise spectrum introduced by that DUT is disclosed. An apparatus includes first and second measurement channels and a controller. The first and second measurement channels are characterized by gains and noise spectrums that are different for the different channels and generate first and second measurement signals. The controller measures an average value of a product of the first and second measurement signals when an input signal is applied to the input of the DUT, the controller providing a measure of the signal to noise ratio of the output of the DUT, independent of the noise spectrums in the first and second measurement channels. Four channel embodiments reduce the amount of calibration needed to measure the gain and noise spectrum of the DUT.

14 Claims, 5 Drawing Sheets

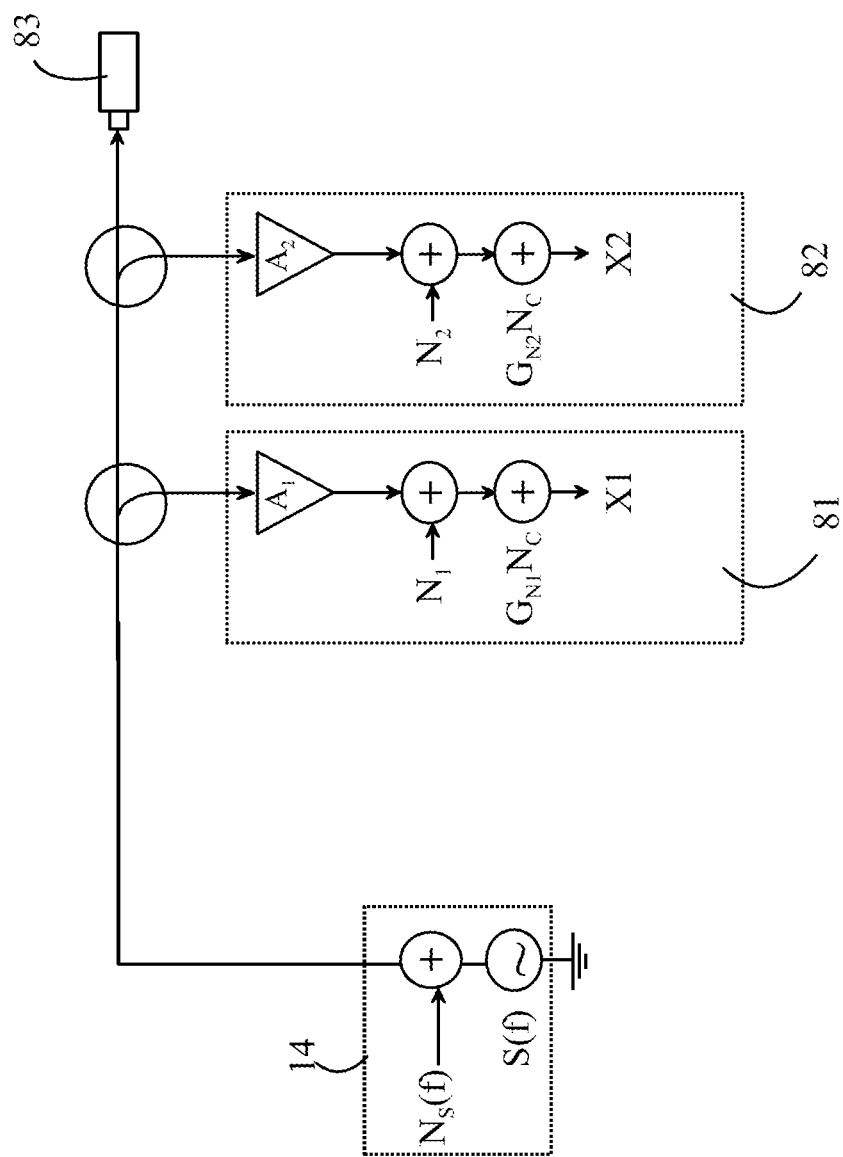

METHOD AND APPARATUS FOR ESTIMATING THE NOISE INTRODUCED BY A DEVICE

BACKGROUND

One goal of device testing is to measure the noise contributed by that device to a circuit in which the device is a component. For example, the noise factor or noise figure of a device under test (DUT) such as an amplifier that is characterized by a voltage gain and noise power spectral density, $N_A$ is one way of characterizing the noise contribution provided by the DUT. Another goal of device testing is to monitor the noise contribution of the DUT while operational signals are passing through the DUT rather than test signals.

Methods for making such noise measurements utilize experimental setups that also introduce noise into the measurements; hence, some method must be used to separate out the noise contributions introduced by the measurement apparatus itself from that contributed by the DUT. Methods that rely on calibrations of the measurement apparatus are known to the art. The calibration processes, however, are time consuming and can limit the accuracy of the DUT measurements. In addition, the DUT measurements are limited to the signals that are provided by the measurement equipment in the configuration provided by the measurement apparatus. These measurements may not accurately represent the noise performance of the DUT in the actual circuit operating with operational signals that are used with the real circuit.

SUMMARY

The present invention includes a method and an apparatus for measuring the properties of a first DUT characterized by a first DUT, a first DUT output, a first DUT signal gain and a first DUT noise spectrum introduced by that first DUT. The apparatus includes first and second measurement channels and a controller. The first measurement channel generates a first measurement signal characterized by a first gain and a first noise spectrum introduced by that channel, the first measurement channel being coupled to the first DUT output. The second measurement channel generates a second measurement signal characterized by a second gain and a second noise spectrum introduced by that channel, the second measurement channel being coupled to the first DUT output. The controller measures an average value of a cross product of frequency spectrums of the first measurement signal and the second measurement signal when an input signal is the first DUT input, the controller providing a measure of a signal-to-noise ratio (SNR) of a signal leaving the first DUT output, the measure being independent of the noise spectrums in the first measurement channel and the second measurement channel.

In one aspect of the invention, the controller determines a first calibration product that includes the average value of the product of the first and second measurement signals using an input signal having a known noise spectrum. The first calibration product is used to generate a SNR measurement of the first DUT. In another aspect, the controller determines a second calibration product that includes the average value of the product of the first and second measurement signals using a second DUT consisting of a through connection that shorts the input and output of the second DUT. The second calibration product is used to generate a measurement of the gain of the first DUT and the noise spectrum introduced by the first DUT.

In another aspect of the invention, the apparatus includes third and fourth measurement channels. The third measurement channel generates a third measurement signal characterized by a third gain and a third noise spectrum introduced by that channel. The third measurement channel is coupled to the input of the first DUT. The fourth measurement channel generates a fourth measurement signal characterized by a fourth gain and a fourth noise spectrum introduced by that channel. The fourth measurement channel is coupled to the first DUT input. The controller measures an average value of a product of the third and fourth measurement signals, and two cross average values include average values of a cross product of frequency spectra of one of the first or second measurement signals with one of the third or fourth measurement signals when an input signal is applied to the input of the first DUT. The controller provides a measure of the SNR of the first DUT output, independent of the noise spectrums in the first, second, third, and fourth measurement channels and independent of any separate calibration measurements using a different DUT.

In a still further aspect of the four measurement channel embodiment, the controller measures the average value of the third and fourth measurement signals when the first DUT is replaced by a second DUT that includes a short circuit between an input to the second DUT and an output of the second DUT. The apparatus further includes a power meter that measures output power from the second DUT. The controller generates a measure of the gain and noise spectrum of the first DUT from the measurements on the first and second DUTs.

In yet another aspect of the invention, the first noise spectrum and the second noise spectrum comprise components that are correlated with one another. The controller provides corrections to the cross-spectrum measurements that correct the correlated components. In one aspect, the corrections are determined by replacing the first DUT with a second DUT in which an input of the second DUT is shorted to an output of the second DUT.

BRIEF DESCRIPTION OF THE DRAWINGS

FIG. 5 illustrates the manner in which the contribution from correlated noise sources can be measured and used to correct the noise measurements.

DETAILED DESCRIPTION OF THE PREFERRED EMBODIMENTS OF THE INVENTION

The present invention uses coherent measurement receivers to eliminate the non-coherent noise source contributions. Coherent measurement channels share a common sample clock, and if RF down-converted, also share common local oscillators or a common frequency source. Methods based on two, three, or four coherent channels can be utilized.

Such coherent channels are part of network analyzers, scopes, digitizers and multi-channel RF receivers.

For the purposes of the present discussion, the noise factor for a DUT is defined to be the SNR of the input signal divided by the SNR of the output signal. To simplify the following discussion, it will be assumed that the DUT is an amplifier having a gain that varies as a function of frequency. The amplifier introduces noise that also varies as a function of frequency. The noise spectral density will be denoted by $N_A(f)$ in the following discussion.

Figure 1:
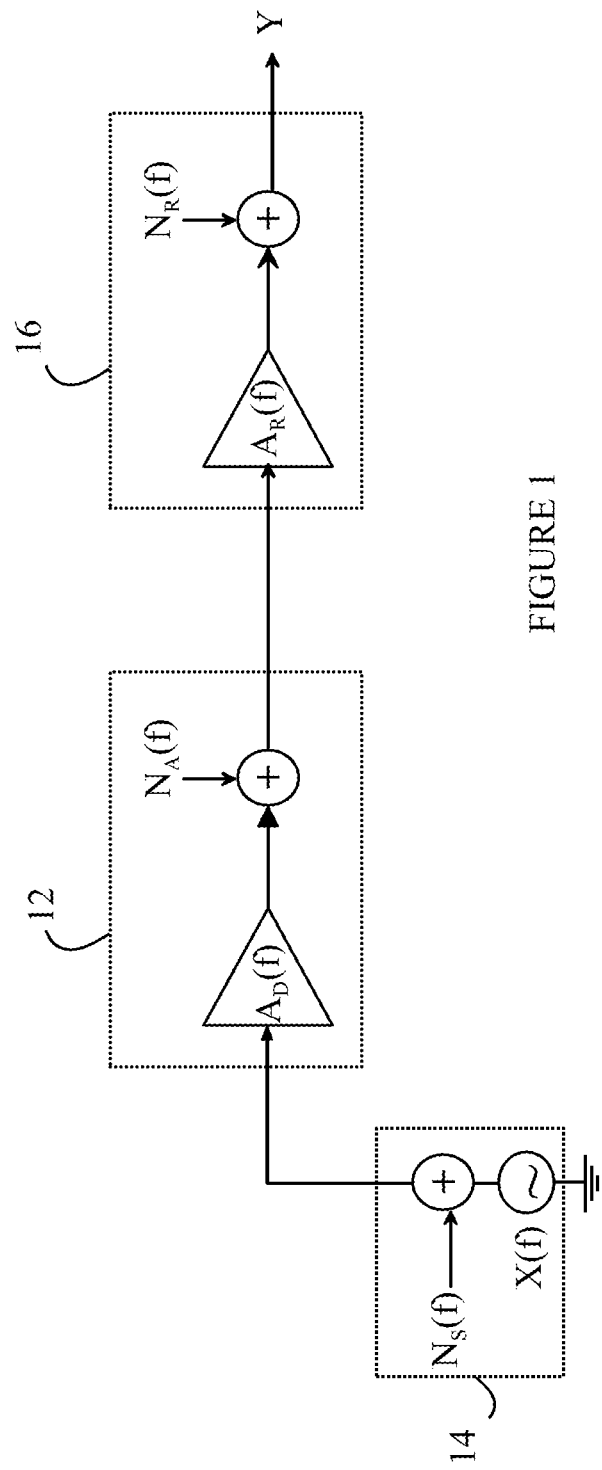
FIG. 1 illustrates a test system for measuring the noise contribution from a DUT that introduces noise with a spectral density, $N_A(f)$.

Refer now to FIG. 1, which illustrates a test system for measuring the noise contribution from a DUT 12 that introduces noise with a spectral density, $N_A(f)$. DUT 12 includes a gain stage having a gain as a function of frequency denoted by $A_D(f)$, DUT 12 is stimulated by a signal source 14 that introduces noise having a spectral density $N_S(f)$. The output of DUT 12 is measured by an instrument 16 that has an instrument gain, $A_R(f)$, and introduces noise with a spectral density, $N_R(f)$. Hence, the output of instrument 16 includes noise contributions from the source, the DUT, and the instrument itself. To provide a measure of the noise contribution from the DUT, the other noise contributions to Y must be removed.

In the prior art, the contributions of the interfering noise sources are reduced by calibrating the receiver and source to obtain measurements of the noise functions $N_S(f)$ and $N_R(f)$. Assuming that these interfering noise sources are not correlated, the contributions can be subtracted from the measure Y spectrum to obtain a measure of $N_A(f)$. However, this approach is limited by the accuracy of the calibration procedures that provide the measurements of the interfering noise spectral density functions.

Figure 2:
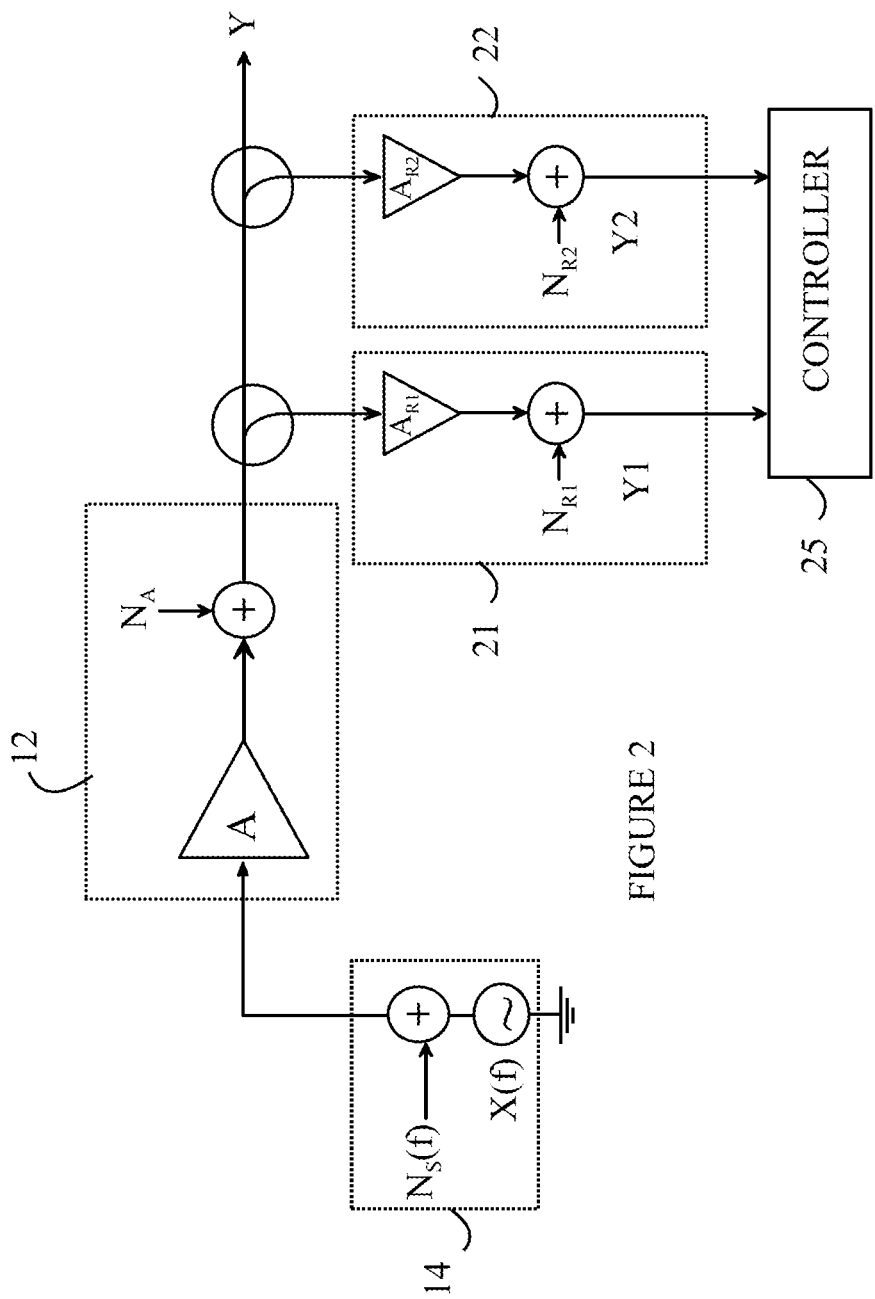
FIG. 2 illustrates one embodiment of a measurement apparatus according to the present invention.

Refer now to FIG. 2, which illustrates one embodiment of a measurement apparatus according to the present invention. To simplify the notation and equations, the frequency dependence of the various functions will not be explicitly shown. In this exemplary embodiment, the receiver has two independent channels that measure the output of DUT 12. Channel 21 is characterized by a gain $A_{R1}$ and a noise spectral density $N_{R1}$. Channel 22 is characterized by a gain $A_{R2}$ and a noise spectral density $N_{R2}$. It is assumed that $N_{R1}$ and $N_{R2}$ are not correlated. By measuring the average values of the cross products of the frequency spectrums of the two channels, such as the cross-correlation spectrums of the outputs of the two channels in controller 25, the noise contributions of $N_{R1}$ and $N_{R2}$ are eliminated, and hence, one of the calibrations discussed above is no longer needed. However, the noise spectrum of the source must still be determined. Controller 25 can be any suitable data processing system including a general purpose computer and/or specialized hardware such as signal processing circuitry.

In one case of interest, signal source 14 is replaced by a termination resistor. In this case, the noise spectrum of the source is known, i.e., kT noise. This noise is amplified by DUT 12, and hence, $$\overline{G_{Y1Y2}(f)}=E[Y1(f)Y2(f)^*]=A_{R1}(f)A_{R2}(f)^*[|N_A(f)|^2+|A(f)|^2kT] \quad (1)$$

Accordingly, if the gains of the two channels and the DUT are known, $N_A$ can be determined. The product of the two gains of the two channels can be determined by replacing the DUT with a through connection. In this case, A=1 and $N_A$=0. Hence, if the gain of the DUT is known, $N_A$ can be determined. Given $N_A$, various noise measures such as the noise factor can be determined.

Figure 3:
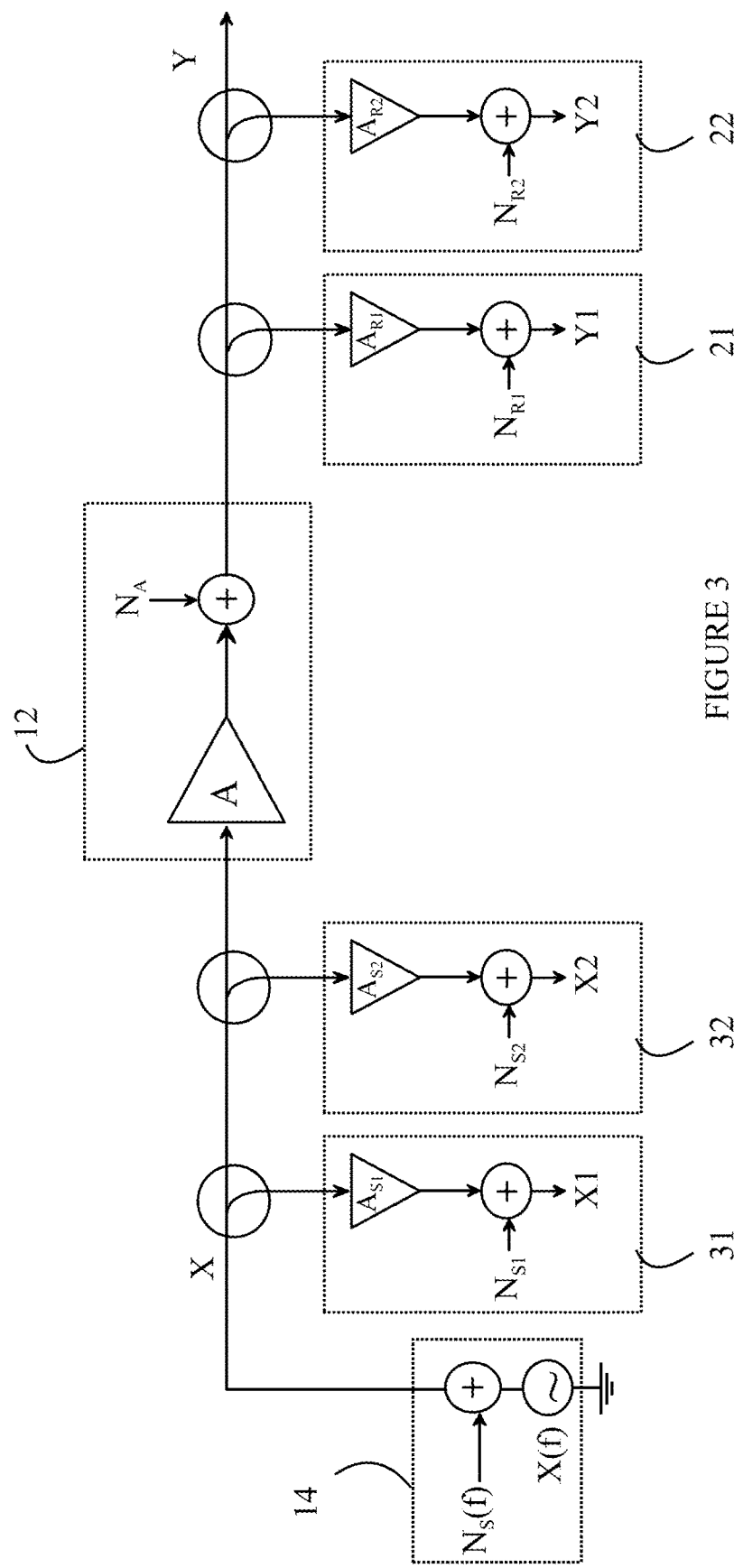
FIG. 3 illustrates a four channel embodiment of a measurement apparatus according to the present invention.

The two channel method eliminates the need for noise calibration measurements and provides greater dynamic range than methods that rely on such noise power subtraction methods. It would be advantageous, however, to provide a method that does not rely on such noise power subtraction methods. Refer now to FIG. 3, which illustrates a four channel embodiment of a measurement apparatus according to the present invention. The four channel measurement system includes two additional channels that measure the input signal to DUT 12. These additional channels are shown at 31 and 32. Each channel has its own gain and introduces noise in a manner analogous to that described above with reference to the two channel embodiments. Again, it is assumed that the noise from any channel is uncorrelated with the noise from any other channel or from the source. To simplify the remaining drawings, the controller that makes the measurements on the outputs of the measurement channels has been omitted; however, it is to be understood that the outputs of the measurement channels and any power meter that measures Y are part of the apparatus.

The present invention uses various cross-products of the spectrums of the first and second measurement signals to determine the SNR spectrum introduced by the DUT without the need for calibration measurements. In one embodiment, the following four cross-spectrum averages are measures:

$$\overline{G_{Y1Y2}}=A_{R1}A_{R2}^*[|N_A|^2+|A|^2|X|^2] \quad (2)$$

$$\overline{G_{Y1X1}}=AA_{R1}^*A_{S1}^*|X|^2 \quad (3)$$

$$\overline{G_{Y2X2}}=AA_{R2}^*A_{S2}^*|X|^2 \quad (4)$$

$$\overline{G_{X1X2}}=A_{S1}A_{S2}^*|X|^2 \quad (5)$$

The frequency dependence in the above quantities has again been omitted to simplify the notation. The SNR contribution from the DUT can be computed from these four measured quantities as follows:

$$SNR = \frac{|AX(f)|^2}{|N_A(f)|^2} = \frac{|\overline{G_{Y1X1}(f)}\overline{G_{Y2X2}(f)}|}{|\overline{G_{Y1Y2}(f)}\overline{G_{X1X2}(f)}|-|\overline{G_{Y1X1}(f)}\overline{G_{Y2X2}(f)}|} \quad (6)$$

It should be noted other cross-spectrum averages could have been used to arrive at a formula for SNR. For example, an analogous relationship for SNR could be derived using $\overline{G_{Y1X2}}$ and $\overline{G_{Y2X1}}$. Hence, the four channel embodiments provide the SNR measurement without relying on calibration data and power subtraction methods.

Figure 4:
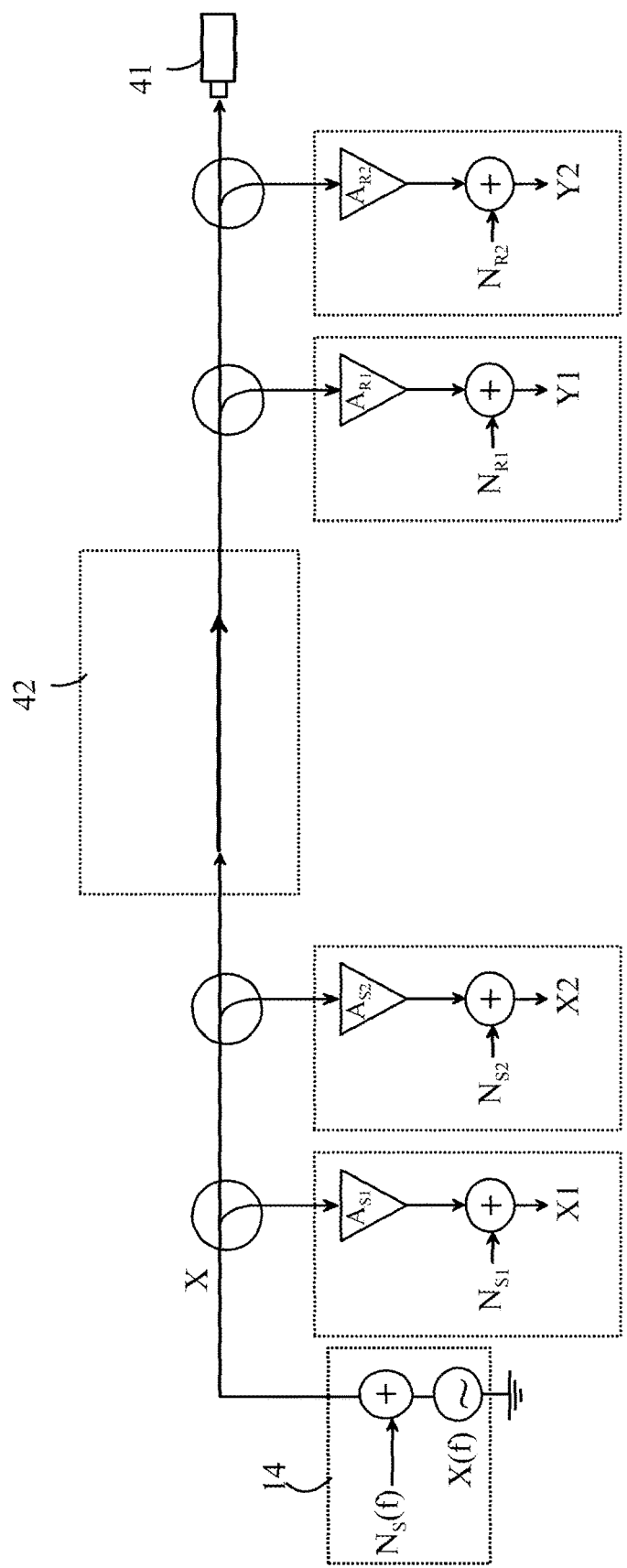
FIG. 4 illustrates one calibration setup for a four channel embodiment of the present invention.

To obtain an estimate of the DUT amplitude, A, and the noise spectrum, $N_A$, some form of calibration is needed. Refer now to FIG. 4, which illustrates one calibration setup for a four channel embodiment of the present invention. In this setup, the DUT is replaced by shortening conductor as shown at 42. The signal from the DUT is also measured by a power meter 41. The various cross-spectrum measurements are normalized by dividing the measured quantities by the measured power. It is assumed that the SNR in the test setup is sufficient to guarantee that the signal in the power meter is a good approximation to $X^2$. In this case, the following three measured cross-spectrum quantities can be used to arrive at a measure for the DUT gain and noise spectrum.

$$\overline{Gcal_{X1X2}}=A_{S1}A_{S2}^* \quad (7)$$

$$\overline{Gcal_{Y1X2}}=A_{R1}A_{S2}^* \quad (8)$$

$$\overline{Gcal_{Y2Y1}}=A_{R1}A_{R2}^* \quad (9)$$

The DUT gain and noise spectrum can then be determined using the following two equations:

$$|N_A|^2 = \frac{\overline{G_{Y1Y2}}}{Gcal_{Y1Y2}} - \left| \frac{\overline{G_{Y1X2}}}{Gcal_{Y1X2}} \frac{\overline{G_{Y2X1}}}{Gcal_{Y2X1}} \frac{Gcal_{X1X2}}{\overline{G_{X1X2}}} \right| \quad (10)$$

$$|A|^2 = \left| \frac{\overline{G_{Y1X2}}}{Gcal_{Y1X2}} \frac{\overline{G_{Y2X1}}}{Gcal_{Y2X1}} \frac{Gcal_{X1X2}}{\overline{G_{X1X2}}} \frac{Gcal_{X1X2}}{\overline{G_{X1X2}}} \right| \quad (11)$$

The above-described embodiments assume that the various noise sources are not correlated with one another. However, in practice, there can be common noise sources which couple into paired measurement channels. These sources often result from shared circuit components such as clocks, local oscillators, power splitters etc. Refer now to FIG. 5, which illustrates the manner in which the contribution from such correlated noise sources can be measured and used to correct the noise measurements. To simplify the discussion, FIG. 5 deals with measuring the effects of the correlated sources without a DUT, i.e., in the input channel to the DUT. In the experimental arrangement shown in FIG. 5, two measurement channels shown at 81 and 82 are used to measure the output of a signal source 14. The output of signal source 14 is also measured by a power meter 83.

Each measurement channel is assumed to have a gain, an uncorrelated noise source, and a correlated noise source. The correlated noise sources are assumed to have a noise spectrum $G_{N1}(f)N_C(f)$ and $G_{N2}(f)N_C(f)$, respectively. Each noise source is represented by a common source having a noise spectrum $N_C$ and a coupling factor G. The present invention compensates for these noise sources by using cross-spectrum noise subtraction. First consider the case in which the signal source 14 is turned on and the noise spectrum, Ns(f) is thermal noise. The cross-correlation spectrum is then given by $$\overline{G_{X1X2}} = A_1 A_2^* |S+N_S|^2 + G_{N1} G_{N2}^* |N_c|^2 \quad (12)$$

or $$\overline{G_{X1X2}} = A_1 A_2^* |S|^2 + A_1 A_2^* |N_S|^2 + G_{N1} G_{N2} |N_c|^2 \quad (13)$$

In the following discussion it is assumed that the correlated noise contributions are independent of the signal strength from signal source 14. If the signal source, S(f), is turned off, leaving only the noise source, the cross-spectrum measurement yields $$\overline{Gnoise\_cal_{X1X2}} = A_1 A_2^* |N_S|^2 + G_{N1} G_{N2}^* |N_c^*|^2 \quad (14)$$

Now assume that S(f) is turned on and that a source is used such that $$A_1 A_2^* |S|^2 >> A_1 A_2^* |N_S|^2 + G_{N1} G_{N2} |N_c|^2 \quad (15)$$

Then power meter 83 measures $|S(f)|^2$ for this high power source. The cross-spectrum from Equation (13) then can be used to measure $A_1 A_2^*$. That is, $A_1 A_2^*$ is the measured cross-spectrum divided by the output of power meter 83. Hence, if $N_S$ is known for a particular signal, the measured value of $A_1 A_2^*$ can be used to estimate $G_{N1} G_{N2} |NC|^2$. Accordingly, during actual measurements, the measured value for the cross-spectrum terms in the two channels can be corrected by subtracting this estimate of $G_{N1} G_{N2} |N_C|^2$. While the above-described embodiments correct for correlated noise in the input measurement channels, the same method can be utilized to correct for correlated noise in the output channels using a calibration DUT in which the input and output of the DUT are shorted together.

The above embodiments of the present invention provide a method and apparatus for measuring the signal to noise ratio of a DUT, the gain of the DUT, and the spectrum of the noise introduced by the DUT. These quantities can also be used to compute other noise parameters of interest to circuit designers such as the noise factor, which is defined as the SNR of the input signal to the SNR of the output signal from the DUT. It can be shown that the noise factor is given by $$F(f) = \frac{SNR_{input}}{SNR_{output}} = \frac{(B|X(f)|^2 - kTB)/kTB}{|A(f)|^2 (B'|X(f)|^2 - kTB')/(|A(f)|^2 kTB' + B'|N_A(f)|^2)} = 1 + \frac{B|N_A(f)|^2}{|A(f)|^2 kTB'}$$

Here B and B' are the bandwidths used to measure the input and output signals, respectively.

The above-described embodiments utilize a controller that computes the various cross-channel products used in the present invention. The controller can be constructed from a wide variety of computational engines including conventional computers and special purpose hardware.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An apparatus for measuring a first DUT characterized by a first DUT input, a first DUT output, a first DUT signal gain and a first DUT noise spectrum introduced by that first DUT, said apparatus comprising:
   a first measurement channel that generates a first measurement signal characterized by a first gain and a first noise spectrum introduced by that channel, said first measurement channel being coupled to said first DUT output;
   a second measurement channel that generates a second measurement signal characterized by a second gain and a second noise spectrum introduced by that channel, said second measurement channel being coupled to said first DUT output; and
   a controller that measures an average value of a cross product of frequency spectrums of said first measurement signal and said second measurement signal when an input signal is input to said first DUT input, said controller providing a measure of a signal-to-noise ratio (SNR) of a signal leaving said first DUT output, said measure being independent of said first noise spectrum and said second noise spectrum.

2. The apparatus of claim 1 wherein said controller determines a first calibration product comprising said average value of said cross product when an input signal is applied to said first DUT input, said input signal having a known noise spectrum, said first calibration product being used to generate an SNR measurement of said first DUT.

3. The apparatus of claim 2 wherein said controller determines a second calibration product comprising said average value of said cross product of said first measurement signal and said second measurement signal using a second DUT consisting of a through connection that shorts an input and an output of said second DUT, said second calibration product being used to generate a measurement of said first DUT signal gain and said first DUT noise spectrum.

4. The apparatus of claim 1 further comprising:
a third measurement channel that generates a third measurement signal characterized by a third gain and a third noise spectrum introduced by that channel, said third measurement channel being coupled to said first DUT input; and
a fourth measurement channel that generates a fourth measurement signal characterized by a fourth gain and a fourth noise spectrum introduced by that channel, said fourth measurement channel being coupled to said first DUT input, wherein
said controller measures an average value of a cross product of frequency spectrums of said third and fourth measurement signals, two cross average values comprising average values of cross products of frequency spectrums of one of said first or second measurement signals with one of said third or fourth measurement signals when an input signal is applied to said first DUT input, said controller providing a measure of a SNR of an output signal from said first DUT output, independent of said first, second, third, and fourth noise spectrums and independent of any separate calibration measurements using a different DUT.

5. The apparatus of claim 4 wherein said controller measures an average value of cross products of frequency spectrums of said third and fourth measurement signals when said first DUT is replaced by a second DUT comprising a short circuit between an input to said second DUT and an output of said second DUT, and wherein said apparatus further comprises a power meter that measures an output power from said second DUT, said controller generating a measure of said first DUT signal gain and a measure of said first DUT noise spectrum from said measurements on said first DUT and said measurements on said second DUT.

6. The apparatus of claim 1 wherein said first noise spectrum and said second noise spectrum comprise components that are correlated with one another, and wherein said controller provides corrections to said average value that correct for said components.

7. The apparatus of claim 6 wherein said corrections are determined by replacing said first DUT with a second DUT in which an input of said second DUT is shorted to an output of said second DUT.

8. A method of operating an apparatus to measuring a first DUT characterized by a first DUT input, a first DUT output, a first DUT signal gain and a first DUT noise spectrum introduced by that first DUT, said method comprising:
generating a first measurement signal characterized by a first gain and a first noise spectrum introduced by a first measurement channel, said first measurement channel being coupled to said first DUT output;
generating a second measurement signal characterized by a second gain and a second noise spectrum introduced by a second measurement channel, said second measurement channel being coupled to said first DUT output;

causing said apparatus to measure an average value of a cross product of frequency spectrums of said first measurement signal and said second measurement signal when an input signal is applied to said first DUT input; and
providing a measure of a SNR of a signal that is output from said first DUT output, independent of said first and second noise spectrums.

9. The method of claim 8 comprising determining a first calibration product comprising said average value of said cross product using an input signal having a known noise spectrum, said first calibration product being used to generate an SNR measurement of said first DUT.

10. The method of claim 9 comprising determining a second calibration product comprising said average value of said cross product of said first measurement signal and said second measurement signal using a second DUT comprising a through connection that shorts an input of said second DUT and to an output of said second DUT, said second calibration product being used to generate a measurement of said first DUT signal gain and said first DUT noise spectrum.

11. The method of claim 8 further comprising:
generating a third measurement signal characterized by a third gain and a third noise spectrum introduced by a third measurement channel, said third measurement channel being coupled to said input of said first DUT; and
generating a fourth measurement signal characterized by a fourth gain and a fourth noise spectrum introduced by a fourth measurement channel, said fourth measurement channel being coupled to said input of said first DUT,
measuring an average value of a cross product of frequency spectrums of said third and fourth measurement signals, two cross average values comprising average values of cross products of frequency spectrums of one of said first or second measurement signals with one of said third or fourth measurement signals when an input signal is applied to said input of said first DUT, and
providing a measure of a SNR of the output of said first DUT, independent of said first, second, third, and fourth noise spectrums and independent of any separate calibration measurements using a different DUT.

12. The method of claim 11 comprising measuring an average value of products of frequency spectrums of said third and fourth measurement signals when said first DUT is replaced by a second DUT comprising a short circuit between an input to said second DUT and an output of said second DUT, and wherein said method further comprises measuring an output power from said second DUT and generating a measure of said first DUT signal gain and said first DUT noise spectrum from said measurements on said first DUT and said second DUT.

13. The method of claim 8 wherein said first noise spectrum and said second noise spectrum comprise components that are correlated with one another, and said method provides corrections to said average value that correct for said components.

14. The method of claim 13 wherein said corrections are determined by replacing said first DUT with a second DUT in which an input of said second DUT is shorted to an output of said second DUT.

* * * * *